United States Patent
Jackson et al.

(10) Patent No.: US 9,774,117 B1
(45) Date of Patent: Sep. 26, 2017

(54) RESILIENT MINIATURE MECHANICAL SUPPORT THAT CAN ALSO SERVE AS AN ELECTRICAL CONNECTOR

(71) Applicant: Northrop Grumman Systems Corporation, Falls Church, VA (US)

(72) Inventors: Charles M. Jackson, Huntington Beach, CA (US); Elizabeth T. Kunkee, Manhattan Beach, CA (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 0 days.

(21) Appl. No.: 15/076,752

(22) Filed: Mar. 22, 2016

(51) Int. Cl.
    *H01R 12/00* (2006.01)
    *H01R 12/71* (2011.01)
    *H01R 12/91* (2011.01)
    *H01R 12/70* (2011.01)
    *B33Y 10/00* (2015.01)
    *B33Y 80/00* (2015.01)

(52) U.S. Cl.
    CPC ....... *H01R 12/714* (2013.01); *H01R 12/7005* (2013.01); *H01R 12/91* (2013.01); *B33Y 10/00* (2014.12); *B33Y 80/00* (2014.12)

(58) Field of Classification Search
    CPC .. H01R 12/714; H01R 12/7005; H01R 12/91; B33Y 10/00; B33Y 80/00
    USPC ........................................ 439/65, 66, 68–69
    See application file for complete search history.

(56) References Cited

U.S. PATENT DOCUMENTS

| | | |
|---|---|---|
| 6,184,053 B1 | 2/2001 | Eldridge et al. |
| 6,255,126 B1 | 7/2001 | Mathieu et al. |
| 7,048,548 B2 | 5/2006 | Mathieu et al. |
| 7,050,293 B2 | 5/2006 | Arbisi et al. |
| 7,126,220 B2 | 10/2006 | Lahiri et al. |
| 7,225,538 B2 | 6/2007 | Eldridge et al. |
| 7,297,003 B2 * | 11/2007 | Rathburn ............... H01R 12/57 439/591 |
| 7,928,751 B2 | 4/2011 | Hsu |

(Continued)

OTHER PUBLICATIONS

Aitek, S.; 3d Scanning and Printing; Week 5 Assignment; Web Page: http://fabacademy.org/archives/2014/students/zitek.scott/week5.html.

(Continued)

*Primary Examiner* — Khiem Nguyen
(74) *Attorney, Agent, or Firm* — Patti & Malvone Law Group, LLC

(57) ABSTRACT

An exemplary miniature support has upper and lower spaced-apart engagement surfaces each having at least a portion that are parallel to each other. Two supports each with an end supporting the upper engagement surface and another end supporting the lower engagement surface. The two supports have a spring-like property so that the upper and lower engagement surfaces can repeatedly move between an uncompressed state when not engaged to provide an interconnection and a compressed state when engaged between two opposing boards to provide an interconnection between the boards. The connector is preferably made using 3-D printing and may be integrally made as part of a board also made using the same 3-D printing. The support may have upper and lower engagement surfaces and at least one of the at least two supports that are conductive to establish connectivity between the upper and lower engagement surfaces.

7 Claims, 2 Drawing Sheets

(56) References Cited

U.S. PATENT DOCUMENTS

| | | | |
|---|---|---|---|
| 8,089,294 B2 | 1/2012 | Hsu et al. | |
| 8,531,042 B2 | 9/2013 | Drost et al. | |
| 8,951,071 B2* | 2/2015 | Tziviskos | H01R 13/15 439/668 |
| 9,276,340 B2* | 3/2016 | Amini | H01R 12/71 |
| 2014/0012216 A1 | 1/2014 | Shaviv | |

OTHER PUBLICATIONS

Manousos, N.; 3D Printed Working Co-Axial Tourbillon 1000%; A Blog to Watch; Web Page: http://www.ablogtowatch.com/3d-printed-working-co-axial-tourbillon-1000-nicholas-manousos-hands/2/; Jul. 26, 2014.

Manousos, N.; Tourbillon 1000% brings 3D printing to watches . . . sort of; gizmag; Web Page: http://www.gizmag.com/tourbillon-1000-3d-printed-mechanical-watch-movement/33121/; Aug. 1, 2014.

Walters, P.; (2009) 3D printing and fabrication of Smart responsive devices: A comparative investigation. In: (2009) NIP25: International Conference on Digital Printing Technologies and Digital Fabrication 2009, Louisville, Kentucky; (Volume) Society for Imaging Science and Technology. ISBN 978-0-89208-287-2; Bristol University of the West of England.

Chowdhury, S. et al; Microelectromechanical systems and system-on-chip connectivity; Circuits and Systems Magazine, IEEE, vol. 2, No. 2, pp. 4-28, Second Quarter 2002; doi:10.1109/MCAS.2002.1045855.

Chowdhury, S. et al; A MEMS socket system for high density SoC interconnection; Circuits and Systems, 2002. ISCAS 2002. IEEE International Symposium on , vol. 1, no., pp. I-657-I-660 vol. 1, 2002 doi:10.1109/ISCAS.2002.1009926.

Kandalaft, N.; High Speed Test Interface Module Using MEMS Technology; (2012). Electronic Theses and Dissertations. University of Windsor (Ontario, Canada). Paper 4818.

Pruitt, B.L. et al; Measurement system for low force and small displacement contacts; Microelectromechanical Systems, Journal of, vol. 13, No. 2, pp. 220-229, Apr. 2004. doi:10.1109/JMEMS.2003.820266.

* cited by examiner

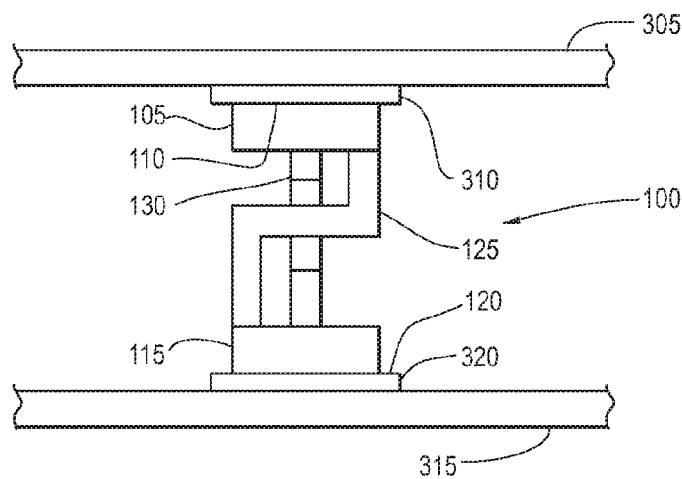
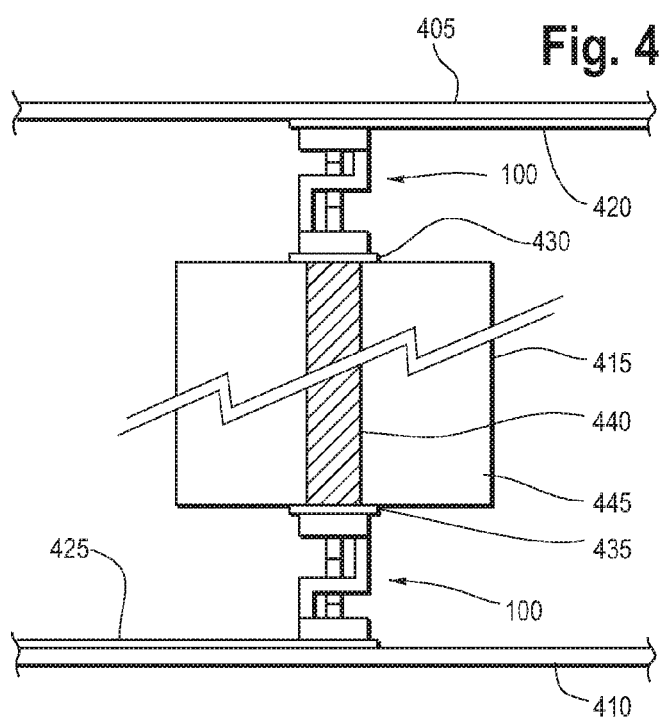
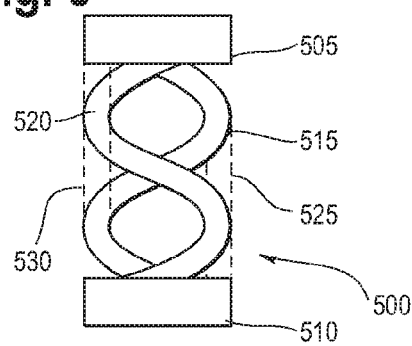

RESILIENT MINIATURE MECHANICAL SUPPORT THAT CAN ALSO SERVE AS AN ELECTRICAL CONNECTOR

BACKGROUND

This invention relates to a resilient miniature mechanical support that can also serve as a electrical connector for establishing a mechanical support between two parallel spaced-apart surfaces and optionally also provide an electrical path between the two such surfaces.

Modern electronics often contain circuitry formed on a plurality of stacked layers/boards, e.g. between two printed circuit boards (PCB), two substrates with patterned metalization, or between two layers of a microwave module or integrated circuit. Where multiple stacked surfaces are used, there exists a need to provide a resilient mechanical support therebetween and for some applications couple electrical signals from circuitry on one layer to another layer. One straightforward approach for coupling electrical signals is to use a conventional wire or wire bond between the respective conductive pads on the two adjacent layers. In another approach, a plurality of rigid perpendicular conductive pins extend from one layer and are in alignment with corresponding receptacles or holes in the other layer to establish electrical connections that may or may not be soldered after the connections are engaged.

Fuzz buttons and solder bumps placed between layers have also been utilized to establish connections with respectively aligned contacts on adjacent parallel layers. However, fuzz buttons are normally time-consuming to install and may be tedious to assemble. Solder bumps require subsequent heating and if several such connections are required, uneven heating or differences in characteristics among the solder bumps may yield unreliable or inconsistent connections. The disassembly of layers connected using either of these techniques for maintenance or repair of the circuitry may result in even greater difficulties where such interconnections are required to be manually reestablished during reassembly of the respective layers. Additionally, the minimum practical size of these types of connectors may negatively impact the performance of RF circuits above a frequency, e.g. above 20 GHz. Thus, there exists a need for an improved mechanical support that can also serve as an electrical interconnector that minimizes such difficulties.

SUMMARY

It is an object of the present invention to satisfy this need.

An exemplary miniature support has upper and lower spaced-apart engagement surfaces each having at least a portion that are parallel to each other. Two supports each with an end supporting the upper engagement surface and another end supporting the lower engagement surface. The two supports have a spring-like property so that the upper and lower engagement surfaces can repeatedly move between an uncompressed state when not engaged to provide an interconnection and a compressed state when engaged between two opposing boards to provide an interconnection between the boards. The connector is preferably made using 3-D printing and may be integrally made as part of a board also made using the same 3-D printing. The support may have upper and lower engagement surfaces and at least one of the at least two supports that are conductive to establish connectivity between the upper and lower engagement surfaces.

Another embodiment of the invention is directed to a method of making the connector using 3-D printing.

A further embodiment of the invention is directed to the method of using 3-D printing to simultaneously make the connector as part of a printed wiring board to which the connector is grown during one 3-D printing operation.

DESCRIPTION OF THE DRAWINGS

Features of exemplary implementations of the invention will become apparent from the description, the claims, and the accompanying drawings in which:

FIG. 3 is a partial cross-sectional view showing the embodiment serving as an exemplary connector providing an electrical connection between two spaced apart layers/boards.

FIG. 4 is a representative cross-sectional view of exemplary connectors providing an electrical connection between adjacent layers/boards via an intermediate spacer.

FIG. 5 is a side view illustrating another exemplary embodiment of a connector in accordance with the present invention.

DETAILED DESCRIPTION

Figure 1:
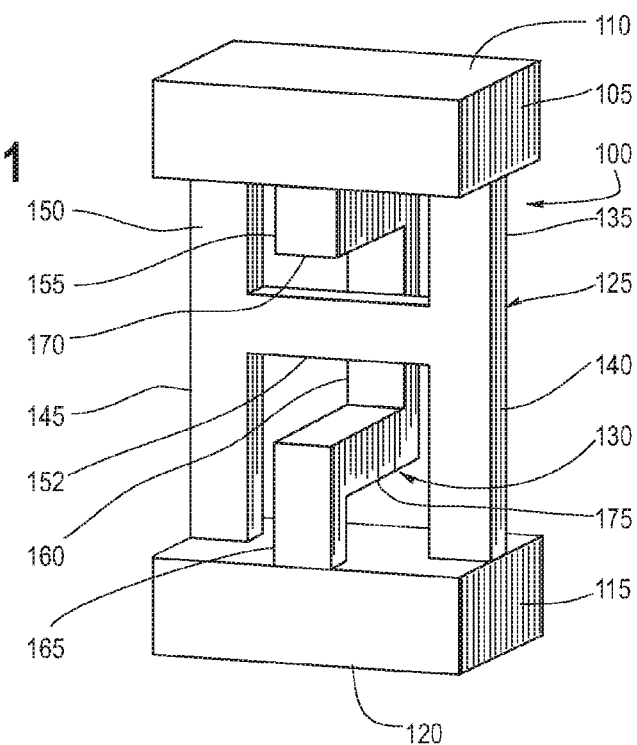
FIG. 1 is a perspective view of an exemplary embodiment in accordance with the present invention.

FIG. 1 shows an exemplary embodiment of a miniature support/connector 100 having a block 105 with an external surface 110 and an opposing block 115 with an external surface 120. As used herein reference to "miniature" in regards to the support/connector refers to a support/connector having a length not more than 20 times its width, with a length of 20 mm or less. Surfaces 110 and 120 are parallel to each other and are disposed to engage corresponding electrical pads on parallel spaced apart layers/boards. Separate independent supports 125 and 130 each have at least one end connected to block 105 and at least one other end connected to block 115. Support 125 includes an upper vertical section 135 and a lower vertical rigidity supplying section 140 forming a substantially straight support between block 105 and block 115. References to "upper" and "lower" as well as "vertical" and "horizontal" are relative to the position of the connector 100 as shown in FIG. 1 and are not necessarily representative of the actual positioning or orientation of the connector in an application. Support 125 includes another upper rigidity supplying vertical section 150 and a corresponding lower vertical section 145 forming another substantially straight support between block 105 and block 115. Support 125 includes a horizontal section 152 having ends mounted adjacent the bottom of upper vertical section 135 and adjacent the top of the lower vertical section 145.

Support 130 includes an upper vertical section 155 coupled to a middle vertical section 160 that is offset from section 155 and connected by a horizontal section 170. Support 130 also includes a lower vertical section 165 that is offset from and connected to the middle vertical section 160 by a horizontal section 175. The bottom end of section 165 is connected to block 115 and the upper end of section 155 is connected to block 105. The amount of offset of the middle vertical section 160 is sufficient to allow the horizontal section 152 of support 125 to lie in the same plane as the upper section 135 and the lower section 145. Support 130 may be generally thought of as being a sideways "U"

with each end being outwardly extended perpendicular from the sides of the U. Support 125 may be generally thought of as being a sideways "Z".

The connector 100 may be preferably made using a 3-D printing process. In one approach, the connector 100 may be initially formed using a 3-D printing process using non-conductive materials and then made conductive by forming a thin film of a conductive material on the surface of the connector, e.g. by plating or plasma ionization. In another approach, the connector 100 may be initially formed utilizing a 3-D printing process using conductive materials. Depending on the layer/board for which the connector will provide a conductive path to another layer/board, it may be preferable to utilize the 3-D printing process to concurrently fabricate the connector and other portions, e.g. the pad, of one of the layer/boards to be connected. For example, the connector 100 may be concurrently 3-D printed so that the upper surface 110 is formed, i.e. grown contiguously, as an continuous extension of a pad on the layer/board to be connected to a corresponding pad on an opposing spaced apart layer/board. As thus fabricated, the connector 100 as well as a likely plurality of other such connectors are permanently attached to and extend outwardly from one of the layers/boards to be interconnected with another such layer/board.

Sections 140 and 150 may be initially formed as part of the connector 100 in order to provide more initial rigidity between blocks 105 and 115 during the manufacturing process. In order to provide a connector 100 which is resilient in the longitudinal direction, i.e. allowing blocks 105 and 115 to be resiliently compressed toward each other, sections 140 and 150 are removed or severed so that no single straight support exists between blocks 105 and 115. The materials utilized to construct support 125 and 130 in combination with the dimensions of such supports are such that forces perpendicular to surfaces 110 or 120 will result in compression of blocks 105 and 115 towards each other due to bending/flexing of supports 125 and 130.

Figure 2:
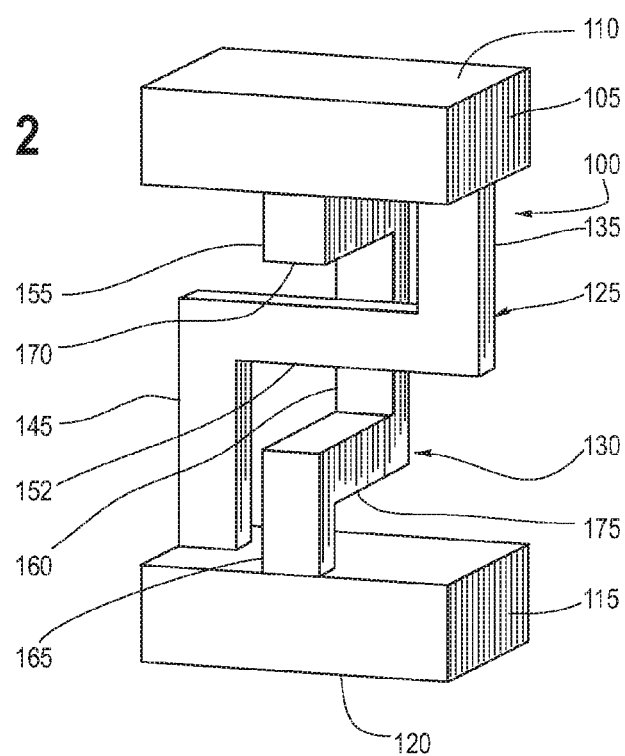
FIG. 2 shows the embodiment of FIG. 1 in a ready to use state.

FIG. 2 shows the connector 100 in a ready to be utilized resilient state in which sections 140 and 150 have been removed. It will be understood that there is sufficient clearance between the horizontal section 152 of support 125 and the horizontal sections 170 and 175 of support 130 so that section 152 does not engage the horizontal sections of the other support during compression of the connector 100. The materials and dimensions selected for the supports preferably retain resiliency so that after separation of the two spaced apart layers/boards for which the conductor provides a connection, the connector 100 will return to substantially its uncompressed longitudinal length. This facilitates repair and reassembly of the stacked board structures since the connectors 100, preferably attached to one of the layers/boards, provides for a relatively easy alignment and reassembly of the stack and interconnectors. It will be appreciated that the structure of embodiment 100 could be made without being electrically conductive and utilized as a resilient spring support between two surfaces/boards. As such it can provide a resilient mechanical support and/or acoustical dampening.

FIG. 3 shows a cross-section of stacked boards utilizing connector 100 with a PCB 305 having conductive pad 310 and PCB 315 having a corresponding conductive pad 320. As used herein, a PCB includes any form of a planar layer having associated electronic components, e.g. without limitation, printed wiring boards, IC wafers/layers and substrates. Surface 110 of block 105 engages the surface of pad 310 and surface 120 of block 115 engages the surface of pad 320. The assembled distance between pads 310 and 320 is less than the uncompressed longitudinal length of connector 100 so that the connector is in compression as it engages the respective pads. The supports 125 and 130 are resilient to bend without breaking or fracturing to accommodate the compression of connector 100. Since the blocks as well as the supports of connector 100 are conductive, an electrical connection is established between pad 310 and 320. Preferably, the ends of supports 125 and 130 that engage the respective blocks are offset relative to each other in order to provide planar stability of surfaces 110 and 120 so that the surfaces remain substantially parallel to each other and to pads 310 and 320 when fully extended as well as when in compression. Referring to FIG. 2, assume that the longitudinal axis is parallel with a Z axis with its origin (as well as the origin of a corresponding X and Y axis) being at the upper left corner of block 115. The lower end of section 145 and the lower end of section 165 meet the upper surface of block 115 at different x-axis and y-axis alignments. This offsetting attachment of the supports contributes to the planar stability of blocks 105 and 115 while not compressed as well as under compression.

FIG. 4 is a representative cross-sectional view of two exemplary miniature connectors 100 providing support and an electrical connection between adjacent layers/boards 405, 410 via an intermediate spacer 415. Boards 405 and 410 include conductive traces 420 and 425, respectively. The intermediate spacer 415 includes an upper conductive surface 430 and a lower conductive surface 435 electrically coupled to each other by a conductive Via 440 extending through the non-conductive body 445 of the intermediate spacer 415. The upper block of the upper connector 100 engages the conductive trace 420 and the lower block of the upper connector 100 engages the conductive surface 430 of spacer 415. The upper block of the lower connector 100 engages the conductive surface 435 and the lower block of the lower connector 100 engages the conductive trace 425. The conductive trace 420 is electrically connected to the conductive trace 425 through the upper connector 100, via 440 of the intermediate spacer 415 and the lower connector 100. The elongate dimension of intermediate spacer 415 is selected based on a desired spacing between boards 405 and 410. Even though the intermediate spacer 415 is not resilient, resiliency is provided between boards 405 and 410 due to the resiliency provided by the two connectors 100. Preferably, the elongate dimension of intermediate spacer 415 is selected so that when combined with the elongate uncompressed dimensions of the two connectors 100, this total dimension is just longer than the desired spacing between boards 405 and 410 in order to provide a desired compressive force on the two connectors 100. The spacer 415 may, for example, have a length of 2 inches or less. Thus, the two connectors 100 provide both mechanical resiliency and electrical conductivity.

FIG. 5 is a side view illustrating another exemplary embodiment of a connector 500 in accordance with the present invention. Exemplary connector 500 has an upper block 505 for engaging one surface to be connected and a lower block 510 for engaging the other surface to be connected. Generally "S" shaped supports 515 and 520 each have one end connected to block 505 and the other end connected to block 510. In order to provide temporary original rigidity, a support section 525 provides an additional point of connection for support 515 with block 510 and support section 530 provides an additional point of connection from another portion of support 515 with block 505. As similarly described with regard to connector 100, sections 525 and 530 are severed or removed prior to a final utilization of the connector in order to let the resilient supports 515 and 520 bend and/or deform in order to allow longitudinal compression between blocks 505 and 510. Connector 500 illustrates that the supports may have a variety of different geometric angles and shapes while still providing the desired resilient functionality of the connector.

Although exemplary implementations of the invention have been depicted and described in detail herein, it will be apparent to those skilled in the art that various modifications, additions, substitutions, and the like can be made without departing from the spirit of the invention. For example, the blocks of the connector may not be a separate component, but may be part of the ends of the supports which may or may not be connected together and may be flattened to provide additional surface area for engaging the respective pads of the boards to be interconnected.

The scope of the invention is defined in the following claims:

1. A method for making a resilient miniature support adapted for providing a support between a first printed circuit board (PCB) and a second PCB that is parallel to the first PCB, the method comprising the steps of:
    forming upper and lower spaced-apart, substantially planar, engagement surfaces that are parallel to each other using a first 3-D printing;
    forming during the first 3-D printing at least two supports each with an end supporting the upper engagement surface and another end supporting the lower engagement surface, one of the at least two supports extending along a first plane that is perpendicular to the upper and lower spaced-apart engagement surfaces and another of the at least two supports extending along a second plane that is also perpendicular to the upper and lower spaced-apart engagement surfaces, the first and second planes being not parallel to each other;
    forming the at least two supports with dimensions and geometric shapes so as to produce a spring-like property so that the upper and lower engagement surfaces can repeatedly move between an uncompressed state having one dimension between the upper and lower engagement surfaces and a compressed state having a dimension between the upper and lower engagement surfaces less than the one dimension.

2. The method of claim 1 further comprising the steps of:
    forming upper and lower blocks with the upper and lower engagement surfaces being surfaces on the upper and lower blocks that face away from each other and away from the supports, the at least two supports each having a first end that is attached to the upper block and a second end that is attached to the lower block.

3. The method of claim 1 wherein the at least two supports comprises a first and second elongated support each being resilient and having a geometric shape that allows compression of the upper and lower spaced-apart engagement surfaces towards each other, the first elongated support flexing during compression substantially along the first plane and the second elongated support flexing during compression substantially along the second plane which is substantially perpendicular to the first plane.

4. The method of claim 1 wherein the upper and lower engagement surfaces and at least one of the at least two supports are conductive to establish electrically connectivity between the upper and lower engagement surfaces so that the resilient miniature support serves as an electrical connector between the first and second PCBs.

5. A method of making at least a portion of a printed circuit board (PCB) with an outwardly extending miniature electrical connector for establishing an electrical connection with another spaced-apart conductive surface parallel to the PCB, the method comprising the steps of:
    forming a pad on a surface of the PWB using a first 3-D printing;
    forming an elongated connector using the first 3-D printing, the elongated connector grown with the pad during the first 3-D printing and having an upper end contiguously formed as a part of the pad, the elongated connector projecting substantially perpendicular from the PCB;
    forming during the first 3-D printing first and second elongated supports that are part of the elongated connector, an end of each of the first and second elongated supports attached to the upper end of the elongated connector and the other ends of each of the first and second elongated supports being attached to a lower end of the elongated connector;
    the pad, the upper and lower ends of the connector, and at least one of the first and second supports being electrically conductive;
    the first and second elongated supports being resilient and having a geometric shape that allows compression of the upper and lower ends of the connector towards each other without permanently deforming the first and second elongated supports, the distance between the upper and lower ends of the connector being a miniature dimension;
    wherein a conductive connection can be established by the connector between the pad on the PCB and the another spaced-apart conductive surface when the distance between the PCB and the another spaced-apart conductive surface is less than the distance by which the connector projects from the PCB.

6. The method of claim 5 further comprising the steps of:
    the pad, the upper and lower ends of the connector, and the first and second supports being formed of a non-conductive material during the first 3-D printing;
    subsequent to the first 3-D printing, applying a coating of conductive material to the pad, the upper and lower ends of the connector, and to at least one of the first and second supports so that electrical conductive is established from the pad to the lower end of the connector.

7. The method of claim 5 further comprising the steps of:
    forming during the first 3-D printing first and second rigidity supports as part of at least one of the first and second elongated supports, the first and second rigidity supports making the at least one of the first and second elongated supports substantially rigid in the elongate dimension to provide structural support for the elongated connector as the latter is formed using the first 3-D printing;
    subsequent to the completed formation of the elongated connector, severing or removing the first and second rigidity supports thereby enabling the resiliency of the elongate connector.

* * * * *